(12) United States Patent
Gebuhr et al.

(10) Patent No.: US 8,975,102 B2
(45) Date of Patent: Mar. 10, 2015

(54) METHOD FOR PRODUCING AN OPTOELECTRONIC DEVICE WITH WIRELESS CONTACTING

(71) Applicant: OSRAM Opto Semiconductors GmbH, Regensburg (DE)

(72) Inventors: Tobias Gebuhr, Regensburg (DE); Hans-Christoph Gallmeier, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/348,585

(22) PCT Filed: Sep. 27, 2012

(86) PCT No.: PCT/EP2012/069126
§ 371 (c)(1),
(2) Date: Mar. 28, 2014

(87) PCT Pub. No.: WO2013/045576
PCT Pub. Date: Apr. 4, 2013

(65) Prior Publication Data
US 2014/0227811 A1     Aug. 14, 2014

(30) Foreign Application Priority Data

Sep. 30, 2011  (DE) .......................... 10 2011 114 668
Nov. 21, 2011  (DE) .......................... 10 2011 055 549

(51) Int. Cl.
*H01L 21/00* (2006.01)
*H01L 33/62* (2010.01)
(Continued)

(52) U.S. Cl.
CPC ............... *H01L 33/62* (2013.01); *H01L 24/24* (2013.01); *H01L 24/82* (2013.01);
(Continued)

(58) Field of Classification Search
None
See application file for complete search history.

(56) References Cited

U.S. PATENT DOCUMENTS

| 6,756,186 | B2 * | 6/2004 | Collins et al. | 430/321 |
| 2003/0181122 | A1 * | 9/2003 | Collins et al. | 445/24 |
| 2008/0197371 | A1 * | 8/2008 | Ottermann | 257/98 |
| 2009/0127573 | A1 * | 5/2009 | Guenther et al. | 257/98 |
| 2010/0276722 | A1 * | 11/2010 | Baur et al. | 257/99 |

FOREIGN PATENT DOCUMENTS

| DE | 10312526 A1 | 10/2003 |
| DE | 10339985 A1 | 3/2005 |
| DE | 102004050371 A1 | 4/2006 |
| DE | 102007046337 A1 | 4/2009 |

(Continued)

*Primary Examiner* — Andres Munoz
(74) *Attorney, Agent, or Firm* — McDermott Will & Emery LLP

(57) ABSTRACT

A method for producing an optoelectronic device is provided, in which a luminescent diode chip (10) is mounted on a base surface (8) on the first terminal area (1) of a carrier (3). An electrically insulating layer (4) is applied to side faces (17) of the luminescent diode chip (10). An electrically conductive layer (5), which leads from a second terminal contact (12) of the luminescent diode chip (10) over the electrically insulating layer (4) to a second terminal area (2) on the carrier (3), is subsequently applied. A photoresist layer (7) is applied to the electrically conductive layer (5), which photoresist layer (7) is exposed by application of an electrical voltage to the luminescent diode chip (10) so that the luminescent diode chip (10) emits radiation (23). After development of the photoresist layer (7), a portion of the electrically conductive layer (5) arranged on the radiation exit surface (9) is removed by means of an etching process, in which the photoresist layer (7) serves as a mask.

12 Claims, 4 Drawing Sheets

Figure 1:
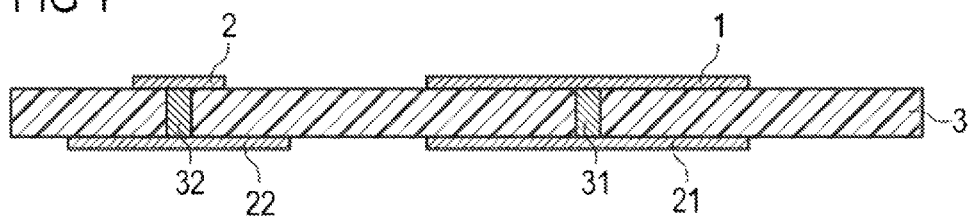

(51) Int. Cl.
*H01L 23/00* (2006.01)
*H01L 33/44* (2010.01)
*H01L 33/50* (2010.01)

(52) U.S. Cl.
CPC ................ *H01L 33/44* (2013.01); *H01L 33/50* (2013.01); *H01L 2933/0066* (2013.01); *H01L 2924/01029* (2013.01)
USPC .............................................. 438/26; 257/99

(56) References Cited

FOREIGN PATENT DOCUMENTS

| | | |
|---|---|---|
| DE | 102008016487 A1 | 10/2009 |
| DE | 102008049188 A1 | 4/2010 |
| DE | 102009051129 A1 | 6/2011 |
| WO | 2009/097786 A1 | 8/2009 |

\* cited by examiner

METHOD FOR PRODUCING AN OPTOELECTRONIC DEVICE WITH WIRELESS CONTACTING

The invention relates to a method for producing an optoelectronic device with wireless contacting.

This patent application claims priority from German patent applications 10 2011 055 549.8 and 10 2011 114 668.0, the disclosure content of which is hereby included by reference.

An optoelectronic device, in particular an LED device, with wireless contacting is known, for example, from publication DE 10 2004 050 371 A1. In the optoelectronic device described therein, an electrical contact on a top side of the LED chip is connected by means of an electrically conductive layer to a terminal contact on a carrier of the LED chip. The electrically conductive layer is led over an electrically insulating layer, which insulates the side faces of the LED chip from the electrically conductive layer in order to avoid a short circuit. In order to achieve a high current carrying capacity of the electrically conductive layer, the electrically conductive layer is preferably formed of a comparatively thick metal layer. However, because a thick metal layer is not transparent, it must not be arranged over the radiation exit surface of the LED chip. The metal layer must therefore either be applied in a structured manner, for example by a printing process, or, after being applied to the whole of the surface, must be structured in such a manner that it does not cover the radiation exit surface of the LED chip.

The structured application of the electrically conductive layer, for example by means of a printing process, or structuring of the electrically conductive layer after application, for example by means of a mask or by means of a laser process, must be carried out with high accuracy and are therefore comparatively complex.

The object underlying the invention is to provide an improved method for producing an optoelectronic device with wireless contacting, with which high accuracy in the structuring of the electrically conductive layer can be achieved with a comparatively low outlay in terms of production.

That object is achieved by a method for producing an optoelectronic device having the features of patent claim 1. Advantageous embodiments and further developments of the invention are the subject matter of the dependent claims.

According to at least one embodiment of the method for producing an optoelectronic device, a carrier is first provided, which carrier has a first terminal area and a second terminal area. The first terminal area and the second terminal area are insulated electrically from one another. The carrier may be, for example, a circuit board. Alternatively, the carrier may comprise, for example, a ceramics material or a semiconductor material.

There is further provided a luminescent diode chip which has a first terminal contact on a base surface and a second terminal contact on a radiation exit surface. The luminescent diode chip may be, for example, an LED chip or a laser diode chip.

According to one embodiment, the luminescent diode chip is mounted on the base surface on the first terminal area. In that manner, the first terminal contact of the luminescent diode chip is advantageously connected electrically conductively to the first terminal area of the carrier. The first terminal contact may be formed, for example, by an electrically conductive substrate of the luminescent diode chip. The second terminal contact on the radiation exit surface of the luminescent diode chip is formed, for example, by a contact metallisation.

In a further method step, an electrically insulating layer is applied to the side faces of the luminescent diode chip. The electrically insulating layer serves to prevent a short circuit at the side faces of the luminescent diode chip during the later application of an electrically conductive layer to produce wireless contacting. The electrically insulating layer may comprise, for example, a plastics material. Alternatively, the electrically insulating layer may also comprise an electrically insulating oxide or nitride compound, for example a silicon oxide. The electrically insulating layer is advantageously so structured that it does not cover at least the second terminal area of the carrier and the second terminal contact of the luminescent diode chip.

According to one embodiment, an electrically conductive layer is applied in a further method step, which electrically conductive layer leads from the second terminal contact of the luminescent diode chip over the electrically insulating layer to the second terminal area on the carrier. In that manner, the second terminal contact of the luminescent diode chip is connected electrically conductively to the second terminal area on the carrier. The electrically conductive layer is advantageously applied to the whole of the surface, so that it completely covers the radiation exit surface of the luminescent diode chip, the electrically insulating layer, and the surface of the carrier facing the luminescent diode chip.

According to one embodiment, a photoresist layer is subsequently applied to the electrically conductive layer.

According to one embodiment, after application of the photoresist layer, an electrical voltage is advantageously applied to the first and second electrical terminal areas in order to generate a current flow through the luminescent diode chip. In that manner, the luminescent diode chip is advantageously caused to emit radiation, which exposes the photoresist layer. In particular, the luminescent diode chip emits radiation through the radiation exit surface, so that the area of the photoresist layer arranged above the radiation exit surface is exposed by the radiation of the luminescent diode chip.

The photoresist layer is subsequently developed, whereby the portion of the photoresist layer arranged on the radiation exit surface of the luminescent diode chip is removed. Outside the radiation exit surface of the luminescent diode chip, the photoresist layer is advantageously not removed during the development, because it has there not been exposed, or at least not sufficiently exposed, by the radiation of the luminescent diode chip.

According to one embodiment, a portion of the electrically conductive layer arranged on the radiation exit surface of the luminescent diode chip is subsequently removed by an etching process, in which the photoresist layer serves as a mask.

It is particularly advantageous in the method that the photoresist layer is exposed by the radiation generated by the luminescent diode chip. Exposure is thus advantageously effected precisely where the luminescent diode chip emits radiation through the radiation exit surface. The photoresist layer thus forms a mask, the opening of which is adapted precisely to the radiation exit surface of the luminescent diode chip, so that the electrically conductive layer is removed precisely from that area in order to avoid absorption in the finished optoelectronic device. In that manner, an outlay in terms of adjustment in particular is avoided, which would be required in the case of exposure with an external light source and an exposure mask for the external light source. By advantageously exposing the photoresist layer by the radiation generated by the luminescent diode chip, the outlay in terms of production is therefore advantageously reduced, and very accurate exposure is achieved at the same time.

The method further has the advantage that a defective luminescent diode chip which does not emit radiation when a voltage is applied to the terminal areas can be picked out in a simple manner. If, for example, in the production of a plurality of optoelectronic components a single luminescent diode chip has a defect, the photoresist layer of that luminescent diode chip is not exposed in the method and the electrically conductive layer is accordingly not removed from the radiation exit surface of that LED chip during the etching process. The presence of the electrically conductive layer on the radiation exit surface can advantageously be detected optically in an automated manner, so that the optoelectronic device with the defective luminescent diode chip can be picked out.

The electrically conductive layer preferably comprises a metal or a metal alloy or consists thereof. In particular, the electrically conductive layer may comprise or consist of gold. Gold is distinguished by high electrical conductivity. Alternatively, the electrically conductive layer may also comprise a transparent conductive oxide such as, for example, ITO.

The electrically conductive layer advantageously has a thickness of from 5 nm to 100 nm. In a preferred embodiment, the electrically conductive layer has a thickness of less than 100 nm, particularly preferably of less than 50 nm. Particularly preferably, the thickness of the electrically conductive layer is from 5 nm to 50 nm. In that case, the electrically conductive layer is on the one hand thick enough to produce an electrically conducting connection between the second terminal area of the carrier and the second terminal contact of the luminescent diode chip. On the other hand, the electrically conductive layer is, however, still thin enough that it has sufficient transparency for the exposure of the photoresist layer. In particular, exposure of the photoresist layer takes place through the electrically conductive layer.

The electrically conductive layer is preferably applied by sputtering. In that manner, the electrically conductive layer can be applied simply and inexpensively to the whole of the surface of the luminescent diode chip, the electrically insulating layer and the carrier with the second terminal area arranged thereon. Complex structured application of the electrically conductive layer, for example by a printing process, is not necessary owing to the subsequent structuring by means of the photoresist layer exposed by the luminescent diode chip.

After the etching process has been carried out, the photoresist layer is advantageously removed and a further electrically conductive layer is electrodeposited on the electrically conductive layer. This advantageously has the result that a contact layer formed of the electrically conductive layer and the further electrically conductive layer has high electrical conductivity. The thin electrically conductive layer applied previously thereby acts as a seed layer for the electrodeposition. The further electrically conductive layer is advantageously deposited during the electrodeposition only on the previously applied electrically conductive layer, in particular, however, not on the radiation exit surface of the luminescent diode chip. Because the electrically conductive layer acts as an electrode for the electrodeposition, the further electrically conductive layer is automatically deposited in the same structure as the previously applied electrically conductive layer.

The further electrically conductive layer is advantageously formed of the same material as the electrically conductive layer. In that case, the electrically conductive layer, which because of the required transmission for the exposure process has a thickness of less than 50 nm, is augmented by the electrodeposition. It is, however, also conceivable for the electrodeposited further electrically conductive layer to be formed of a different material than the previously applied electrically conductive layer.

The further electrically conductive layer preferably comprises a metal or a metal alloy or consists thereof. In particular, the further electrically conductive layer may comprise or consist of gold or copper. Gold and copper are distinguished by high electrical conductivity.

Preferably, the further electrically conductive layer has a thickness of at least 1 µm. For example, the thickness of the further electrically conductive layer may be from 1 µm to 50 µm inclusive. In that manner, a high current carrying capacity is advantageously achieved.

In a preferred embodiment, the carrier has on a rear side remote from the luminescent diode chip a first rear-side contact and a second rear-side contact. The first rear-side contact is advantageously connected to the first electrical terminal area of the carrier by means of a first via, which leads from a front side of the carrier facing the luminescent diode chip to the rear side of the carrier. The second rear-side contact is advantageously connected electrically conductively to the second terminal area by means of a second via, which leads from a front side of the carrier facing the luminescent diode chip to the rear side of the carrier. The electrical contacting of the first and second terminal areas on the carrier can therefore advantageously take place from the rear side of the carrier. In particular, the application of the voltage to the first and second terminal areas during the exposure of the photoresist layer with the radiation generated by the luminescent diode chip can take place by application of a voltage to the first and second rear-side contacts. In particular, this has the advantage that the first terminal area on the carrier, on which the luminescent diode chip is arranged, does not have to be accessible for external electrical contacting. For example, the luminescent diode chip may completely cover the first terminal area on the carrier.

The invention is explained in greater detail below with reference to an exemplary embodiment in conjunction with FIGS. 1 to 11, in which:

FIGS. 1 to 11 show a schematic representation of an exemplary embodiment of the method for producing an optoelectronic device with reference to intermediate steps.

In the figures, identical or identically acting elements are in each case provided with the same reference numerals. The elements illustrated and their size ratios to one another should not be regarded as being to scale.

As is illustrated in FIG. 1, there is first provided in the method a carrier 3, which has a first terminal area 1 and a second terminal area 2. The carrier 3 is advantageously formed of an electrically insulating material, for example a plastics material or a ceramics material. In a preferred embodiment, the first terminal area 1 is connected by means of a first via 31, which passes through the carrier 3, to a first rear-side contact 21. The second terminal area 2 is advantageously connected by means of a second via 32, which passes through the carrier 3, to a second rear-side contact 22. The terminal areas 1, 2, the vias 31, 32 and the rear-side contacts 21, 22 are each advantageously formed of a metal or a metal alloy.

Figure 2:
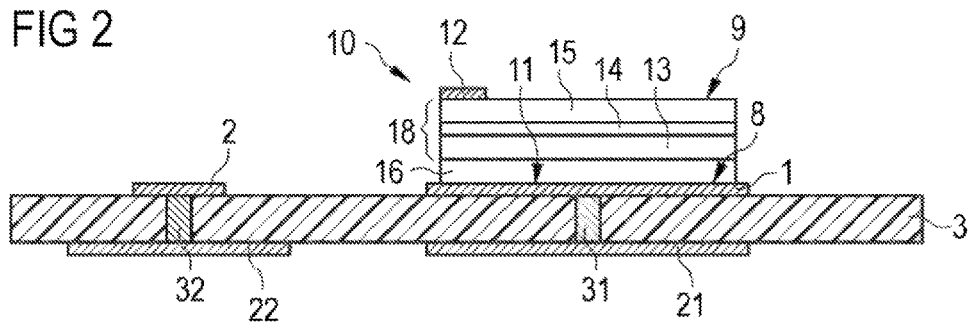

In the intermediate step illustrated in FIG. 2, a luminescent diode chip 10 has been mounted on the first terminal area 1 of the carrier 3. The luminescent diode chip 10 is preferably an LED chip. The luminescent diode chip 10 may, for example, be soldered or adhesively bonded to the first electrical terminal area 1 by means of a solder or a conductive adhesive (not shown). The luminescent diode chip 10 has a first electrical terminal contact 11 on the base surface 8 and a second electrical terminal contact 12 on a radiation exit surface 9 remote from the base surface 8. The first terminal contact 11 may be formed, for example, by the rear side of an electrically conductive substrate 16 of the luminescent diode chip 10, which at the same time forms the base surface 8 of the luminescent diode chip 10. The second terminal contact 12 is preferably formed by a contact metallisation, which is preferably arranged in an edge area of the radiation exit surface 9.

The luminescent diode chip 10 comprises, for example, a first semiconductor area 13, which has a first conductor type, and a second semiconductor area 15, which has a second conductor type. An active layer 14 is arranged between the first semiconductor area 13 and the second semiconductor area 15. The first semiconductor area 13 and the second semiconductor area 15 may each be formed of a plurality of sublayers.

The active layer 14 is a radiation-emitting active layer. The active layer may be in the form of, for example, a pn-junction, a double heterostructure, a single quantum well structure or a multi quantum well structure. The semiconductor layer sequence 18 of the luminescent diode chip 10, which is formed by the first semiconductor area 13, the active layer 14 and the second semiconductor area 15, is preferably formed of III/V compound semiconductor materials. In particular, the semiconductor layer sequence 18 may comprise arsenide, phosphide or nitride compound semiconductor materials. The first semiconductor area 13 may, for example, be an n-type semiconductor area, and the second semiconductor area 15 may be a p-type semiconductor area.

The substrate 16 of the luminescent diode chip 10 may be a growth substrate which was used for the epitaxial growth of the semiconductor layer sequence 18.

Alternatively, however, the luminescent diode chip 10 may also be a so-called thin-film light-emitting diode chip, in which a growth substrate used for the epitaxial growth of the semiconductor layer sequence 18 has been detached from the luminescent diode chip 10. In that case, the substrate 16 of the luminescent diode chip 10 is a carrier substrate 16 that is different from the growth substrate of the luminescent diode chip 10 and, for example, was applied after the epitaxial growth of the semiconductor layer sequence 18 to a major face of the luminescent diode chip remote from the original growth substrate. In this embodiment, the radiation exit surface 9 of the luminescent diode chip 10 is arranged on the side of the original growth substrate. Between the carrier substrate 16 and the first semiconductor area 13 there may be arranged in particular a mirror layer (not shown), in order to reflect the radiation emitted from the active layer 14 in the direction towards the carrier substrate 16 to the radiation outcoupling surface 9. In the embodiment of the luminescent diode chip 10 as a thin-film light-emitting diode chip, the first semiconductor area 13 is preferably a p-type semiconductor area, and the second semiconductor area 15 is an n-type semiconductor area.

Figure 3:
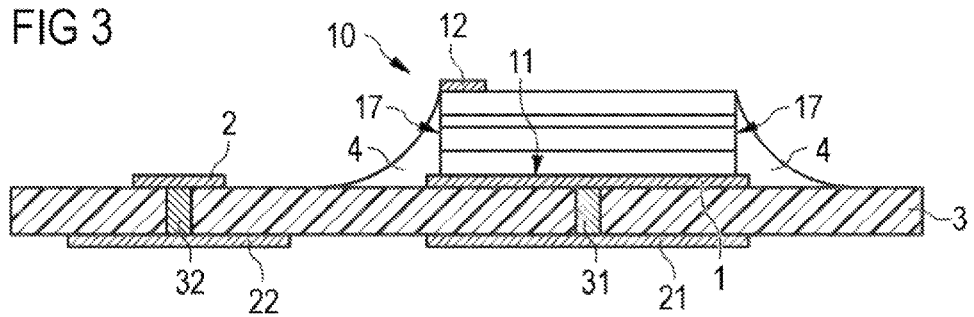

In the intermediate step illustrated in FIG. 3, an electrically insulating layer 4 has been applied to the side faces 17 of the luminescent diode chip 10. The electrically insulating layer 4 is, for example, an electrically insulating plastics layer or an oxide, nitride or oxynitride layer. For example, the electrically insulating layer 4 may be a silicon oxide, silicon nitride or silicon oxynitride layer.

Figure 4:
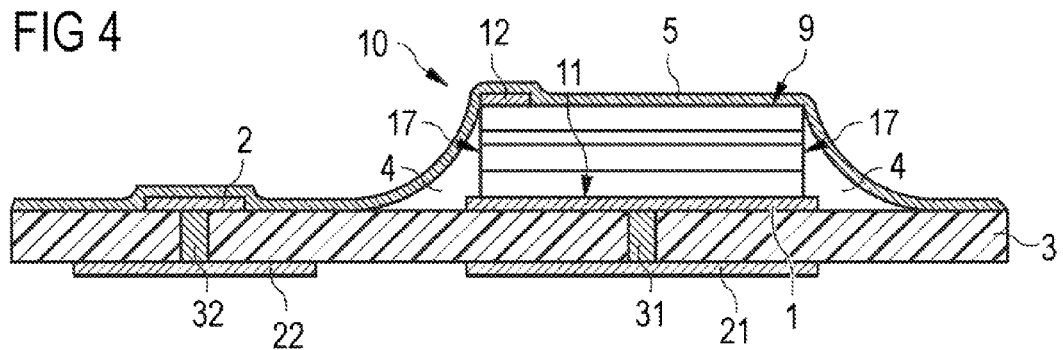

In the intermediate step illustrated in FIG. 4, an electrically conductive layer 5 has been applied to the whole of the surface of the surface of the luminescent diode chip 10, the surface of the carrier 3 facing the luminescent diode chip 10, the second terminal area 2 and the electrically insulating layer 4. The electrically conductive layer 5 is preferably a layer of a metal or a metal alloy. Preferably, the electrically conductive layer 5 is a gold layer. By means of the electrically conductive layer 5, an electrically conducting connection between the second terminal area 2 of the carrier 3 and the second terminal contact 12 of the luminescent diode chip 10 is in particular produced. The side faces 17 of the luminescent diode chip 10 and the first terminal area 1 are advantageously insulated from the electrically conductive layer 5 by the electrically insulating layer 4. The electrically conductive layer 5 is preferably applied by means of sputtering. The thickness of the electrically conductive layer 5 is preferably less than 100 nm, particularly preferably less than 50 nm, for example from 5 nm to 50 nm.

Figure 5:
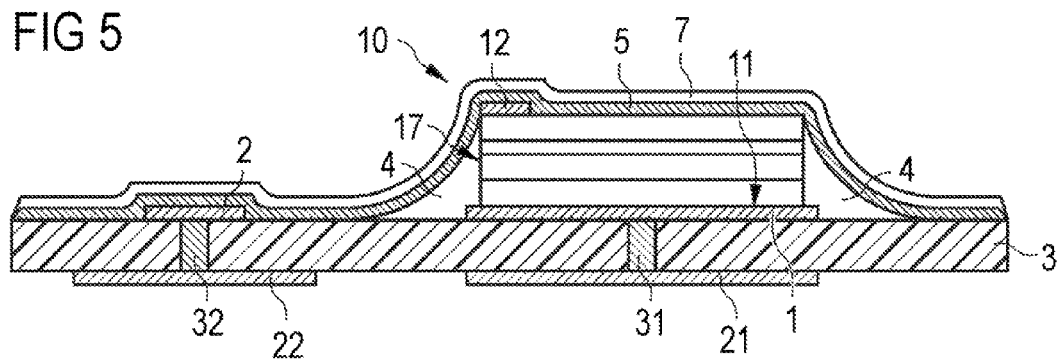

In the intermediate step illustrated in FIG. 5, a photoresist layer 7 has been applied to the electrically conductive layer 5. The photoresist layer 7, like the electrically conductive layer 5, is applied over the whole of the surface, that is to say it covers the electrically conductive layer 5 preferably completely.

Figure 6:
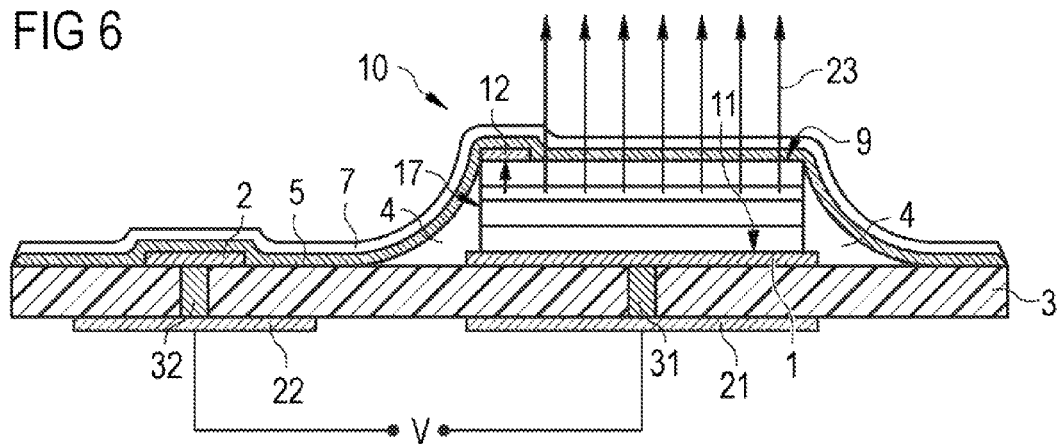

Subsequently, as illustrated in FIG. 6, an electrical voltage V is applied to the first terminal area 1 and the second terminal area 2. Because the first terminal area 1 is connected electrically conductively to the first rear-side contact 21 and the second terminal area 2 is connected electrically conductively to the second rear-side contact 22, this can advantageously be carried out by applying a voltage V to the rear-side contacts 21, 22. This is advantageous in particular because the first terminal area 1 in the exemplary embodiment is covered by the luminescent diode chip 10 and the electrically insulating layer 4 and accordingly is not directly contactable from outside. Because the first terminal area 1 is connected to the first terminal contact 11 and the second terminal area 2 is connected to the second terminal contact 12 of the luminescent diode chip 10 by way of the electrically conductive layer 5, application of the electrical voltage V effects a current flow through the luminescent diode chip 10. The luminescent diode chip 10 therefore advantageously emits radiation 23, which exposes an area of the photoresist layer 7 arranged above the radiation exit surface 9.

It is advantageous that the electrically conductive layer 5 is a comparatively thin layer, which preferably has a thickness of less than 100 nm, for example from 5 nm to 50 nm. The electrically conductive layer 5 therefore has sufficiently great transmission that the radiation 23 of the luminescent diode chip 10 emitted through the radiation exit surface 9 has a sufficiently great intensity that the photoresist layer 7 is exposed. Outside the areas arranged directly over the radiation exit surface 9, on the other hand, sufficient radiation 23 is not transmitted through the electrically conductive layer 5 to expose the photoresist layer 7. In particular, the area of the photoresist layer 7 that is arranged above the second terminal contact 12 is not exposed, because the second terminal contact 12 in that area absorbs the radiation 23 emitted by the luminescent diode chip 10.

Figure 7:
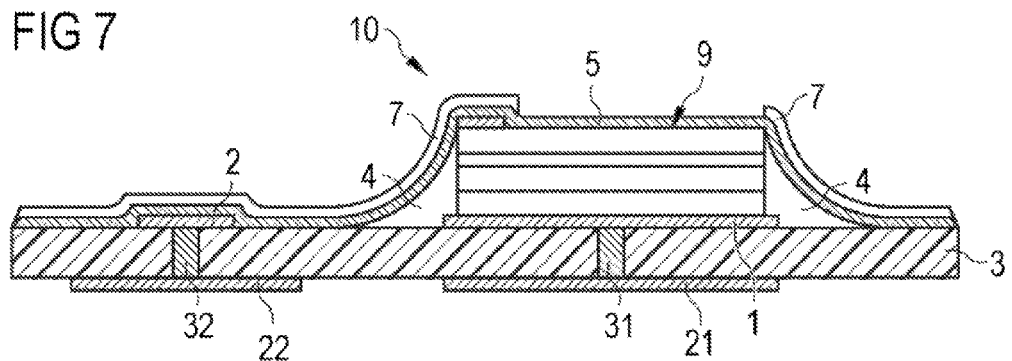

In the intermediate step illustrated in FIG. 7, the photoresist layer 7 has been developed. The photoresist layer 7 now exhibits an opening in the previously exposed areas, which are arranged above the radiation exit surface 9 of the luminescent diode chip 10. The photoresist layer 7 thus advantageously forms a mask layer, the opening of which corresponds with high accuracy to the radiation exit surface 9 of the luminescent diode chip 10. As a result of the advantageous exposure of the photoresist layer 7 by means of the radiation emitted by the luminescent diode chip 10, this is advantageously achieved without an additional outlay in terms of adjustment, which would be necessary, for example, in the case of exposure of the photoresist layer with an external light source.

Figure 8:
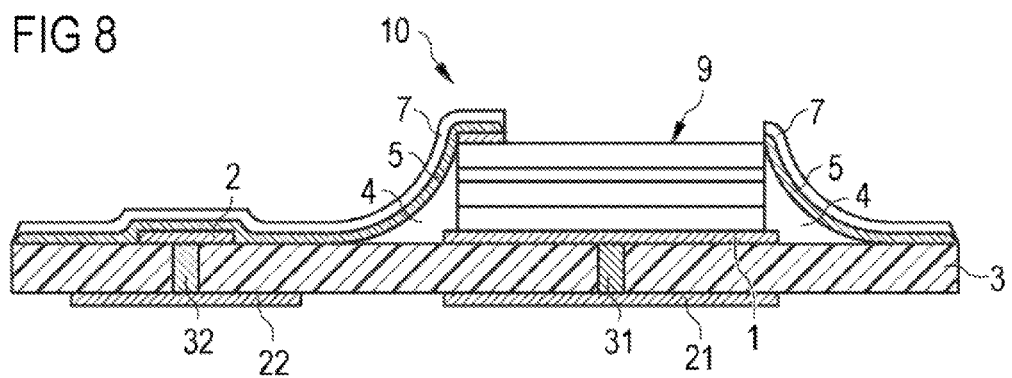

In the intermediate step illustrated in FIG. 8, an etching process has been carried out using the photoresist layer 7 so produced as an etching mask. By means of the etching process, a portion of the electrically conductive layer 5 arranged on the radiation exit surface 9 has been removed.

That would not be the case if the photoresist layer 7 had previously not been exposed owing to a defect of the luminescent diode chip 10. In the case of a defective luminescent diode chip 10, the electrically conductive layer 5 therefore remains on the radiation exit surface 9 of the luminescent diode chip 10 during the method described herein. This can be determined in a simple manner in an optical examination, so that an optoelectronic device with a defective luminescent diode chip 10 can automatically be picked out in a simple manner.

Figure 9:
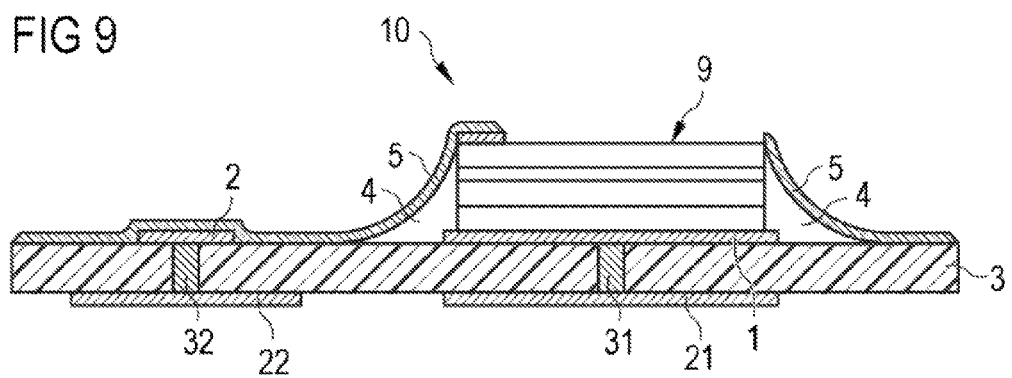

In the method step illustrated in FIG. 9, the photoresist layer has been removed from the structured electrically conductive layer 5.

Figure 10:
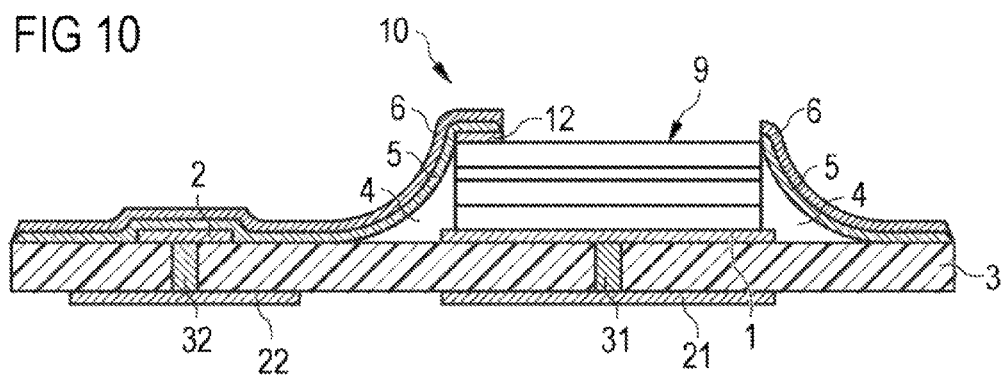

As illustrated in FIG. 10, a further electrically conductive layer 6 is advantageously electrodeposited on the electrically conductive layer 5 in a further method step. In that manner, the previously applied, comparatively thin electrically conductive layer 5 is augmented. The electrodeposited further electrically conductive layer 6 preferably has a thickness of at least 1 µm. For example, the further electrically conductive layer 6 may be from 1 µm to 50 µm thick.

The electrically conductive layer 5 acts as a seed layer for the electrodeposition of the further electrically conductive layer 6. This has the advantage that the further electrically conductive layer 6 is deposited only on the already structured electrically conductive layer 5 and accordingly has the same structure. In particular, the radiation exit surface 9 of the luminescent diode chip 10 is not covered by the further electrically conductive layer 6. The further electrically conductive layer 6 preferably comprises a metal or a metal alloy. The further electrically conductive layer 6 may in particular be formed of the same material as the electrically conductive layer 5. In that case, the thickness of the electrically conductive layer 5 is augmented by the electrodeposition of the further electrically conductive layer 6. For example, the electrically conductive layer 5 and the further electrically conductive layer 6 each comprise gold. Alternatively, it is also conceivable, however, that the further electrically conductive layer 6 comprises a different material than the previously applied electrically conductive layer 5. For example, the further electrically conductive layer 6 may be a copper layer.

The electrically conductive layer 5 and the further electrically conductive layer 6 together form a comparatively thick contact layer, which connects together electrically the second terminal area 2 on the carrier 3 and the second electrical terminal contact 12 on the luminescent diode chip 10. In that manner, wireless electrical contacting of the luminescent diode chip 10 is achieved, which is comparatively flat as compared to contacting with a bonding wire and has a high current carrying capacity.

Figure 11:
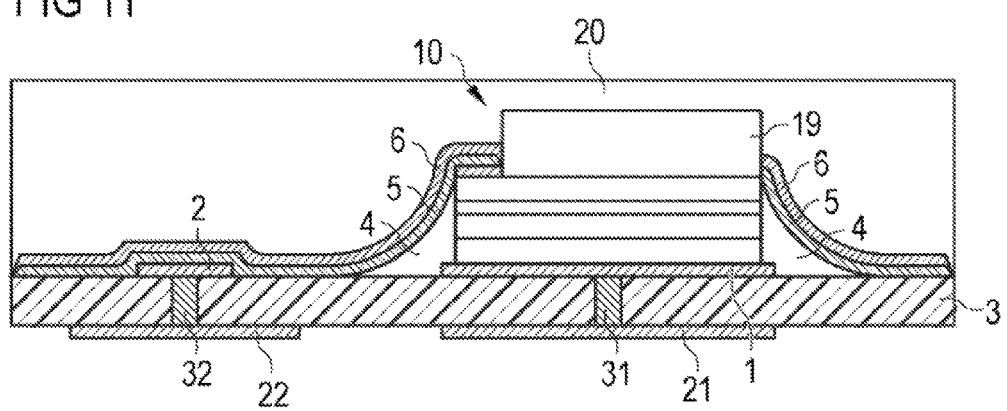

In the optional method step illustrated in FIG. 11, a luminescent conversion layer 19 has been applied to the radiation exit surface 9 of the luminescent diode chip 10. The luminescent conversion layer 19 advantageously comprises a luminescent substance which converts at least part of the radiation emitted by the luminescent diode chip 10 to a greater wavelength. In that manner, for example, white light can be generated by means of a luminescent diode chip 10 that emits in the ultraviolet or blue spectral range. The luminescent conversion layer 19 may be adhesively bonded to the luminescent diode chip 10, for example, in the form of a plate comprising, for example, a ceramics material or a silicone.

The optoelectronic device may further be provided with a potting material 20 in order to protect it in particular from external influences such as, for example, dirt or moisture. The potting material 20 may comprise, for example, a silicone.

Alternatively or in addition to the luminescent conversion layer 19, the potting material 20 may comprise a luminescent substance in order to convert part of the emitted radiation to a different wavelength. Furthermore, it is also possible for the potting material 20 to comprise diffuser particles, in order to diffuse the radiation emitted by the luminescent diode chip 10 and/or radiation striking the optoelectronic device from outside.

The invention is not limited as a result of the description made with reference to exemplary embodiments. Instead, the invention encompasses any novel feature and any combination of features, including in particular any combination of features in the claims, even if that feature or that combination is not itself explicitly indicated in the claims or exemplary embodiments.

The invention claimed is:

1. Method for producing an optoelectronic device, comprising the steps:
   providing a carrier (3) which has a first terminal area (1) and a second terminal area (2),
   providing a luminescent diode chip (10) which has a first terminal contact (11) on a base surface (8) and a second terminal contact (12) on a radiation exit surface (9),
   mounting the base surface (8) on the first terminal area (1),
   applying an electrically insulating layer (4) to side faces (17) of the luminescent diode chip (10),
   applying an electrically conductive layer (5), which extends from the second terminal contact (12) of the luminescent diode chip over the electrically insulating layer (4) to the second terminal area (2) of the carrier (3),
   applying a photoresist layer (7) on the electrically conductive layer (5),
   applying an electrical voltage to the first (1) and second (2) terminal areas, so that the luminescent diode chip (10) emits radiation (23) which exposes the photoresist layer (7),
   developing the photoresist layer (7), whereby a portion of the photoresist layer (7) arranged on the radiation exit surface (9) is removed,
   removing a portion of the electrically conductive layer (5) arranged on the radiation exit surface (9) by means of an etching process, in which the photoresist layer (7) serves as a mask.

2. Method according to claim 1, wherein the electrically conductive layer (5) comprises a metal or a metal alloy.

3. Method according to claim 1, wherein the electrically conductive layer (5) comprises gold.

4. Method according to claim 1, wherein the electrically conductive layer (5) has a thickness of less than 100 nm.

5. Method according to claim 1, wherein the electrically conductive layer (5) is applied by sputtering.

6. Method according to claim 1, wherein, after the etching process has been carried out, the photoresist layer (7) is removed and a further electrically conductive layer (6) is electrodeposited on the electrically conductive layer (5).

7. Method according to claim 6,
wherein the further electrically conductive layer (6) is formed of a same material as the electrically conductive layer (5).
8. Method according to claim 6,
wherein the further electrically conductive layer (6) comprises a metal or a metal alloy.
9. Method according to claim 6,
wherein the further electrically conductive layer (6) comprises gold or copper.
10. Method according to claim 6,
wherein the further electrically conductive layer (6) has a thickness from 1 μm to 50 μm inclusive.
11. Method according to claim 1,
wherein the carrier (3) has on a rear side remote from the luminescent diode chip (10) a first rear-side contact (21) and a second rear-side contact (22), wherein the first rear-side contact (21) is connected by means of a first via (31) to the first terminal area (1) and the second rear-side contact (22) is connected by means of a second via (32) to the second terminal area (2).
12. Method according to claim 11,
wherein the electrical voltage is applied to the first (21) and second (22) rear-side contacts.

* * * * *